United States Patent [19]
Davies

[11] Patent Number: 6,038,194
[45] Date of Patent: Mar. 14, 2000

[54] MEMORY DECODER WITH ZERO STATIC POWER

[75] Inventor: Thomas J. Davies, Albuquerque, N.Mex.

[73] Assignee: Philips Electronics North America Corporation, New York, N.Y.

[21] Appl. No.: 09/221,950

[22] Filed: Dec. 28, 1998

[51] Int. Cl.[7] .............. G11C 8/00; G11C 7/00; G11C 16/06
[52] U.S. Cl. ............... 365/230.06; 365/203; 365/185.21
[58] Field of Search ................ 365/185.21, 185.25, 365/185.33, 185.23, 230.06, 203

[56] References Cited

U.S. PATENT DOCUMENTS

| | | | |
|---|---|---|---|
| 5,056,063 | 10/1991 | Santin et al. | 365/185.21 |
| 5,515,322 | 5/1996 | Kondo | 365/185.21 |
| 5,627,790 | 5/1997 | Golla et al. | 365/185.21 |
| 5,661,684 | 8/1997 | Wong et al. | 365/185.21 |
| 5,671,186 | 9/1997 | Igura | 365/185.25 |
| 5,687,352 | 11/1997 | Beat | 395/481 |
| 5,812,456 | 9/1998 | Hull et al. | 365/185.21 |
| 5,835,410 | 11/1998 | Yach et al. | 365/185.21 |

*Primary Examiner*—Trong Phan
*Attorney, Agent, or Firm*—Brian J. Wieghaus

[57] ABSTRACT

A decoder for a memory cell which uses dynamic current to sense the conduction state of a memory cell. The decoder includes a sense circuit that is pre-charged from a voltage source. Upon disconnection of the sense circuit from the voltage source and connection of the memory cell to circuit ground via an access switch, the sense circuit is discharged if the memory cell is conductive and retains its charge if the memory cell is not conductive. The sense circuit outputs a signal indicative of the conduction state of the memory cell in dependence on whether the sense circuit is discharged or not. For low frequency operation, a weak feedback transistor maintains the sense circuit in the charged state after it is initially charged, and after connection to a memory cell if the memory cell is not conductive, to sustain the output signal and counteract the effects of the circuit leakage.

17 Claims, 3 Drawing Sheets

MEMORY DECODER WITH ZERO STATIC POWER

BACKGROUND OF THE INVENTION

1. Field of the Invention

The invention relates to a decoder which decodes the conduction state of memory cells in a memory array, and particularly, to an improvement that reduces the static power consumption of the decoder. The invention also relates to a programmable logic device ("PLD") employing the improved decoder to initialize logic arrays of the PLD during start up of the PLD.

2. Description of the Prior Art

Memories in electronic devices include an array of memory cells arranged in rows and columns and various peripheral circuits which address individual cells in the array to program a cell, erase a cell and read the programmed state of a cell. FIG. 1A illustrates one type of electrically erasable programmable read only memory (EEPROM) cell 10 A having a CMOS memory transistor 1 and an access transistor 15. The memory transistor 1 has a drain D, a source S, a floating gate FG, and a control gate CG that is coupled to a bit line BL. As is well known in the art, the cell 10 can be programmed, by applying appropriate voltages to the drain, source and control gate, so that the channel 11 of the device is conductive (representing a first logic state) or non-conductive (representing the other logic state). The non-conductive state is achieved by charging the floating gate with negative charge carriers. The conductive state is obtained when the negative charge carriers are removed from the floating gate. The access transistor 15 has a control gate coupled to a word line WL which receives a read address ($R_{ADD}$) signal. The access transistor is selectively turned on and off by the $R_{ADD}$ signal to allow the memory cell to be read, programmed or erased. The cell 10 is known as a full-featured EEPROM since the access transistor 1 allows each byte or memory transistor 1 to be individually addressed. Standard and flash EEPROM's do not have an access transistor associated with each memory transistor, and must be erased in groups.

A sense amplifier 20 selectively coupled to the bit line allows the state of the cell 10 A to be read. During a read operation, the access transistor 15 is rendered conductive to couple the source of the memory transistor 1 to device ground. A low DC voltage is applied to the bit line BL by the sense amplifier or a separate load circuit. The sense amplifier 20 determines the logic level of the cell by sensing the level of current flowing through the channel of the cell and comparing to a reference current. A conductive cell will have a current flow higher than the reference current and will be detected as a first logic state. A non-conductive cell will have little or no current and will be detected as the other logic state. Whether a conductive cell is considered logic high or logic low is arbitrary and depends on the application. Details of programming and erasing the cell of FIG. 1 A are known, among others, from U.S. Pat. No. 5,687,352.

FIG. 1B illustrates a second type of memory cell 10B which isolates the read operation from the programming operation using an additional high voltage NMOS (HVNMOS) transistor 17. Such a cell is bulk erased by, for example, making it non-conductive by applying the following signals: CG=$V_{pp}$ (12 v); $P_{ADD}$=logic "1" (5 V); DATA= logic "0" (Gnd); $R_{ADD}$="0". This initially removes any charge on the floating gate FG of transistor 1. When CG is subsequently coupled to ground, however, the floating gate acquires a negative charge, rendering transistor 1 non-conductive. The cell is programmed by coupling CG to ground, applying $V_{pp}$ (12 v) to $P_{ADD}$ and then applying a signal 0 V or $V_{pp}$ as the DATA signal. If DATA=$V_{pp}$ the transistor 1 is rendered conductive. If DATA=0 V, then the transistor is not conductive.

A drawback of conventional sense amplifiers is that a static DC voltage is made available to the bit lines during the read operation. Since a memory array includes a large plurality of cells, when the decoder is used to read the state of the memory, for example during initialization of a battery operated electronic device, more than an inconsequential amount of power is used. This is of a particular concern as the market for low voltage devices increases. For example, Philips Semiconductors markets a line of low voltage complex PLD's ("CPLDs") under the brand name COOLRUNNER™. These devices operate nominally at 3 V, after initialization of the logic arrays from a non-volatile memory. However, during initialization of the logic arrays, the static DC power drawn from the sense amplifier is more than that used by the CPLD during normal operation. The power draw during the initialization is inconsistent with the desired low power, low voltage operation of the device.

SUMMARY OF THE INVENTION

Accordingly, there is a need for a memory decoder for electronic devices which uses less static power than those currently available in the art.

Generally speaking, according to one aspect of the invention, a decoder for a memory cell uses dynamic current to sense the conduction state of a memory cell. The decoder includes a sense circuit that is pre-charged from a voltage source while the access switch of the associated memory cell is switched off. Upon disconnection of the sense circuit from the voltage source and the switching on of the access switch for the memory cell, the sense circuit is discharged if the memory cell is conductive and retains its charge if the memory cell is not conductive. The sense circuit outputs a signal indicative of the conduction state of the memory cell in dependence on whether the sense circuit is discharged or not.

The invention is based on the recognition that it is not necessary to couple a voltage source directly to a memory cell in order to sense current flow through the memory cell, as in known devices. The invention is based on the further recognition that circuit portions within an integrated circuit have enough parasitic capacitance to maintain a small charge to sustain a voltage at a given node for high frequency operation. For low frequency operation, this pre-charge can be sustained by a trickle current provided by a weak feedback transistor to counteract the effects of leakage. Thus, the present invention uses the dynamic charging of a chargeable circuit portion, and whether or not this chargeable circuit portion is discharged by a memory cell, to produce a decode output signal indicative of the conduction state of the memory cell. In this way, no static power is consumed. The only current that may be consumed is that very small current which may be provided to counteract leakage in the circuit to maintain the sense circuit charged after pre-charging and if a memory cell is not conductive.

The invention also relates to a method of decoding a memory cell and to a programmable logic device which initializes a programmable array from a non-volatile memory array with the decoder according to the invention.

These and other object, features and advantages of the invention will become apparent with reference to the following detailed description and the drawings.

DETAILED DESCRIPTION OF THE PREFERRED EMBODIMENTS

Figure 2:
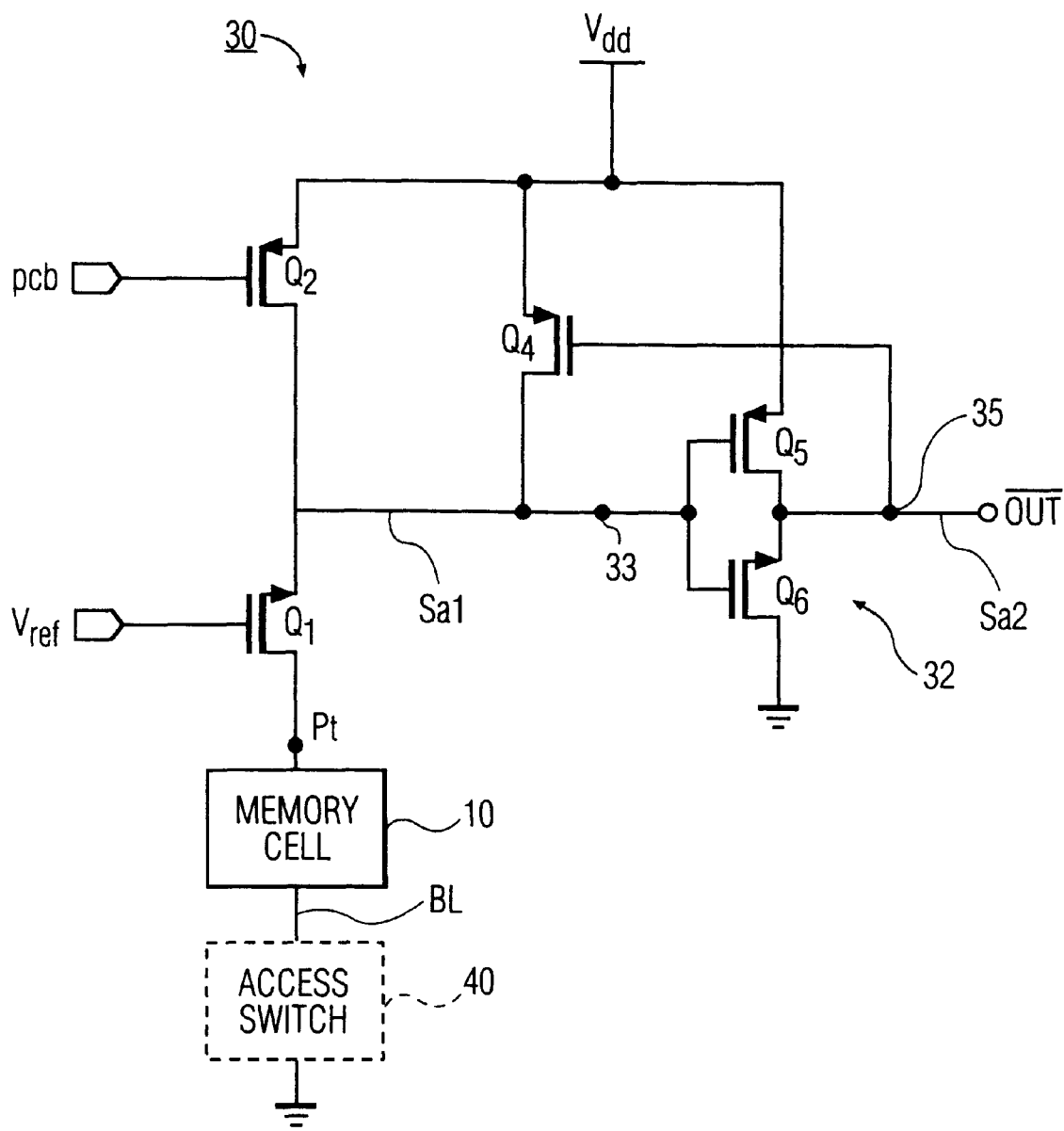
FIG. 2 is circuit diagram of a dynamic sense circuit according to the invention.

FIG. 2 is a circuit diagram of a sense circuit 30 which forms part of a decoder according to the invention. The sense circuit includes a first terminal Pt for coupling to the memory cell, input switches Q1, Q2, an inverter 32 formed by the switches Q5, Q6, and a feedback switch Q4. The switch Q1 is an NMOS transistor having a control gate coupled to an input terminal Vref, a source coupled to a terminal Pt, and a drain coupled to the drain of the switch Q2, which is a PMOS transistor. The pre-charge transistor Q2 has a control gate coupled to an input terminal pcb ("pre-charge bar"), which receives a control clock signal. A source of the transistor Q2 is coupled to a first voltage source Vdd.

The inverter 32 has an input node 33 coupled to the drain of the transistor Q1 via line SA1 and an output node 35 coupled to output line SA2 and to the output terminal $OUT_{BAR}$ of the sense circuit. The inverter is formed by a PMOS transistor Q5 having a source coupled to the voltage source Vdd, a control gate coupled to the inverter input node 33, and a drain coupled to the drain of the NMOS transistor Q6. The control gate of the transistor Q6 is coupled to the inverter input node 33 and the source of the transistor Q6 is coupled to a second, lower voltage source, in this case ground. The feedback switch Q4 is a PMOS transistor having a source coupled to the voltage source Vdd, and a drain coupled to the line SA1. The control gate of the feedback transistor Q4 is coupled to the output of the inverter at node 35.

Figure 1A:
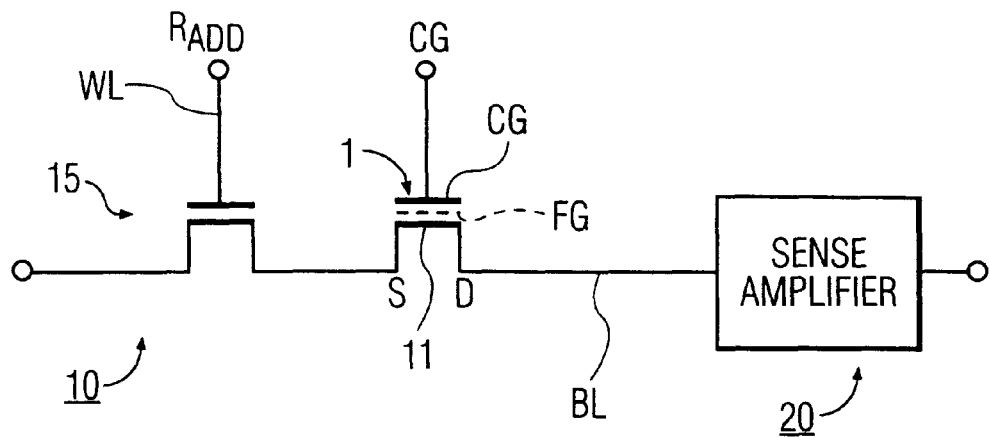
FIG. 1A illustrates a first type of conventional EEPROM memory cell, and a sense amplifier.
Figure 1B:
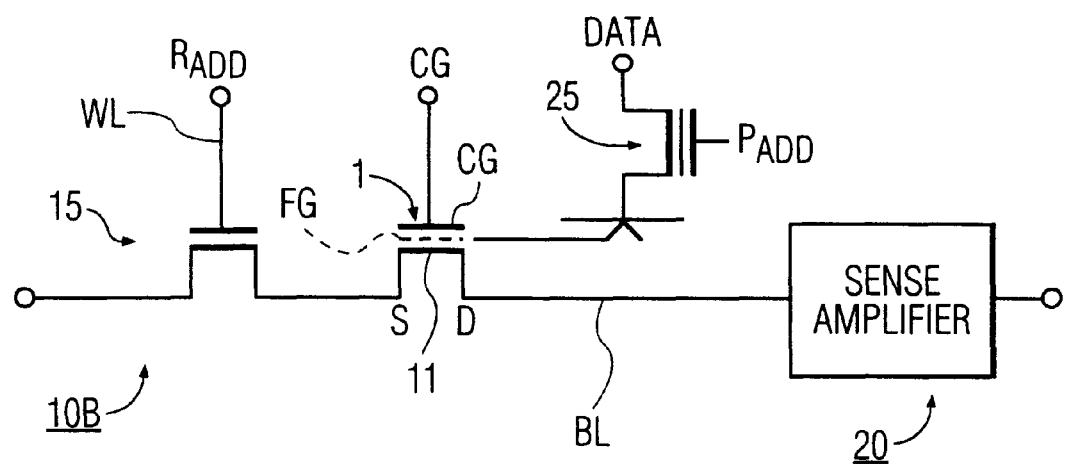
FIG. 1B illustrates a second type of conventional EEPROM cell.

The sense circuit 30 is selectively coupled to ground through the memory transistor 1 by an access switch. The access switch may be physically located within the memory array adjacent the memory transistor as in the case of the cell 10 of FIG. 1. For other types of memory cells, a separate access switch 40 as illustrated in dashed lines may be provided. Initially, the access switch is open, disconnecting the memory transistor 1 from ground. The switch Q1 is normally conductive, being held ON by a reference voltage applied at the terminal Vref. In this case the reference voltage is approximately equal to Vdd/2. The input terminal pcb is driven low, rendering the PMOS pre-charge switch Q2 conductive, and charging the line SA1 to the voltage Vdd. The voltage at terminal Pt is one threshold below the reference voltage $V_{REF}$, due to the voltage drop across the switch Q1. Since the voltage on line SA1 is logic high, the PMOS switch Q5 is OFF (non-conductive) and the NMOS switch Q6 is conductive. The node 35 of the sense circuit is thus coupled to ground, and logic low, as is the output terminal $OUT_{BAR}$. The PMOS feedback switch Q4 is then also in the ON state. Thus, initially, the line SA1 and the terminal Pt are pre-charged without the terminal Pt being coupled to ground through the memory cell.

It should be noted that the node 33 is held at a logic high level partly by charge retention and partly by replenishment from source Vdd via transistor Q4. The charge is held in the sense circuit 30 by parasitic capacitance in the line SA1 as well as by the body capacitance of the feedback transistor Q4, the transistors Q5 and Q6, and the transistors of the memory cell itself. The line SA1 and the body capacitance of the transistors Q4, Q5, Q6 thus form a chargeable circuit portion of the sense circuit. The feedback transistor Q4 is a weak transistor, meaning that it has a conduction channel with a large ratio of L/W. The transistor Q4 is selected to provide just enough current from source Vdd to maintain the voltage at node 33 at the logic high level when the charge transistor Q2 is turned off. Thus, the transistor Q4 provides a trickle current (on the order of nano-amps) to counteract leakage from the circuit. By way of illustration, the transistor Q4 provides only about 1/50 of the current to line SA1 as does the transistor Q2, depending on the actual leakage on the bit line.

The terminal pcb is then driven logic high, which turns the pre-charge switch Q2 OFF. The line SA1 and node 33 retain their logic level for the reasons described above. A memory cell 10 is then decoded by rendering its access switch conductive to couple the memory transistor to ground. If the memory cell is conductive, the line SA1 and terminal Pt will be discharged, pulling the inverter input node 33 low. This is because the memory cell 10 sinks more charge than can be sourced from Vdd by the weak feedback transistor Q4. The output of the inverter 32 will then be logic high, turning the feedback switch Q4 off. Since the switches Q2 and Q4 are both off, the line SA1 is not charged by the voltage source Vdd, and the output terminal $OUT_{BAR}$ of the sense amplifier remains at logic high. The conductive memory cell 10 actively pulls down the node 33, keeping the output ($OUT_{BAR}$) of the sense circuit 30 logic high. If the memory cell 10 coupled to the terminal Pt is not conductive, the terminal Pt and the line SA1 will not be discharged by the memory cell 10. The output of the inverter 32 will then remain low, keeping the feedback transistor Q4 conductive. With feedback transistor Q4 conductive, the line SA1 remains charged by the source Vdd, keeping the decode output of the sense circuit logic low. The weak feedback transistor Q4 thus keeps the node 33 high in the time period when the sense circuit has been charged by the transistor Q2 and before the memory transistor has been coupled to ground by the access switch as well as after the memory transistor has been coupled to ground by the access switch if the memory transistor is not conductive.

Figure 3:
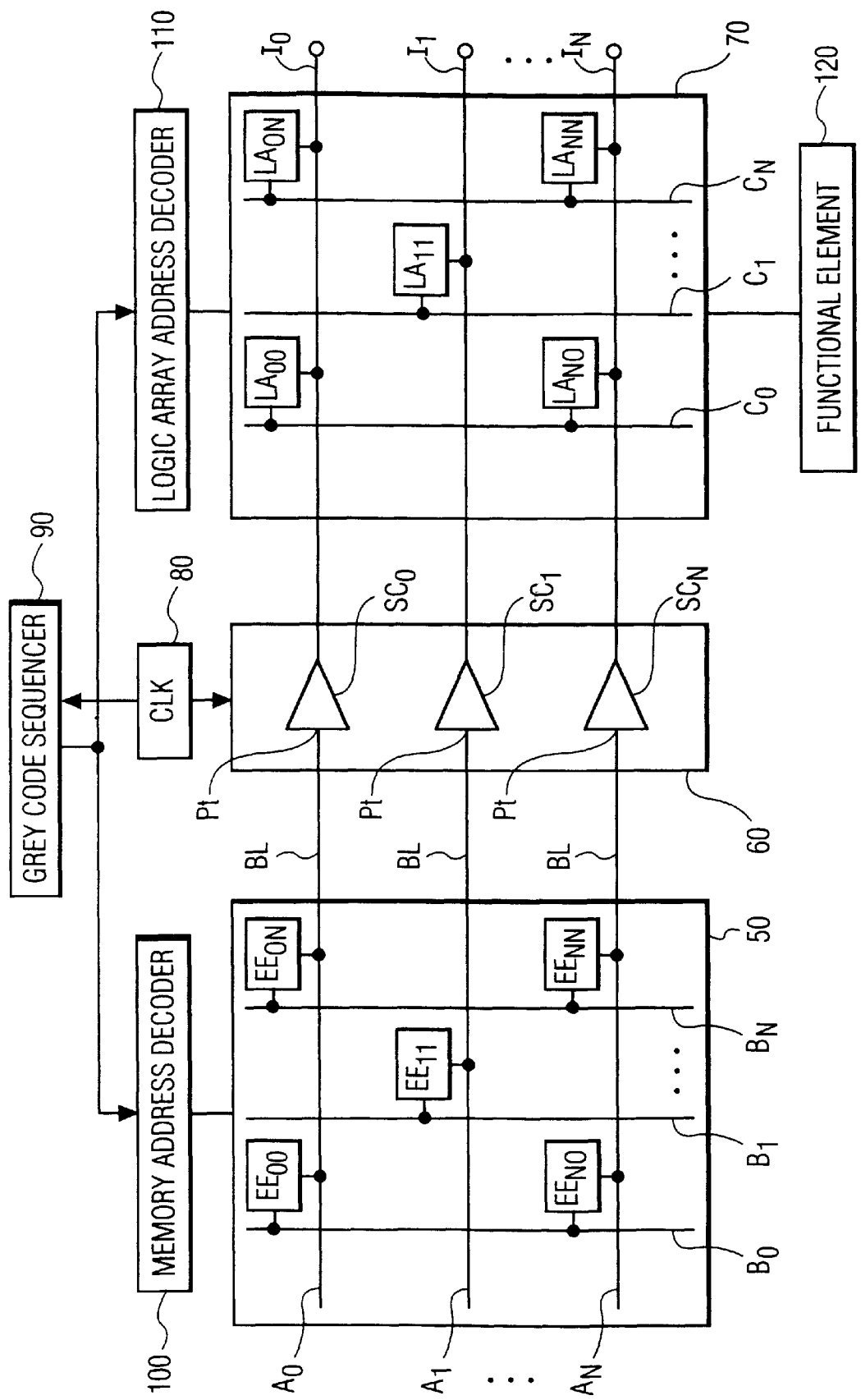
FIG. 3 is a functional block diagram of a PLD having a logic array and a memory device with a dynamic sense circuit according to the invention.

In FIG. 3, the feedback transistor Q4 is provided since the sense circuit is intended for low frequency operation, where the pre-charge is held for at least 200–300 ns before the access switch is rendered conductive. Transistor Q4 thus prevents premature change of the logic state of node 33 prior to decoding the memory cell. While it is possible to provide a capacitive storage element to counteract the effects of leakage, from a semiconductor fabrication standpoint it is just as easy to provide a feedback transistor Q4 as such a storage element. For high frequency operation where the pre-charge must be held only for a much shorter period (e.g. 2–3 ns), the feedback transistor would not be necessary, as the body capacitance of the line SA1, the inverter-transistors, and of the memory cell itself would maintain node 33 high in the short time period between pre-charge and activation of the access switch.

The sense circuit of the invention has the advantage that only dynamic DC current is used during the decode process. In other words, a DC source is not coupled to the memory cell while the memory cell access switch is conductive, except for the trickle charge provide by feedback transistor Q4. Rather, the voltage source Vdd is used to pre-charge the sense circuit, while the memory cell is not coupled to ground. When the memory cell is coupled to ground by the access switch to decode the memory cell, dynamic current will flow if the cell is conductive due to discharging of the sense circuit. As compared to known decode circuits in which DC is coupled during the decode process, considerably less power is dissipated.

FIG. 3 illustrates a PLD which includes a memory array with a decoder according to the invention. The PLD includes a non-volatile memory array 50 which includes a plurality of EEPROM memory cells ($EE_{00}$–$EE_{NN}$) arranged in rows (bit lines $A_0$–$A_N$) and columns (word lines $B_0$–$B_N$). An array of sense circuits 60 includes a plurality of circuits $SC_0SC_N$ as shown in FIG. 2, each having a terminal Pt coupled to a respective bit line $A_0$–$A_N$. A programmable array 70 includes a plurality of programmable elements $LA_{00}$ through $LA_{NN}$ arranged in rows $A_0$–$A_N$ and columns $C_0$–$C_N$. Data inputs $I_0$ through $I_N$ are coupled to corresponding rows $A_0$ through $A_N$. The inputs $I_0$ through $I_N$ are coupled for example to the output of another logic array or to input pins of the PLD. In this case, the programmable elements are SRAM elements, but may be another form of a latch.

A functional element 120 is coupled to the programmable array 70. The functional element may be, for example, array of logic gates such as OR gates or AND gates. Alternatively, the functional element may be a macrocell. A macrocell is circuit which controls the routing of data within a PLD. For example, a macrocell may include a multiplexor and one or more logic gates and control how data is routed from one logic array to another or to an output pin of the PLD. The programmable array 70 determines how the inputs $I_0$–$I_N$ are coupled to the functional element 120.

A clock 80 provides clock signals to a Gray Code sequencer 90 as well as to the pcb input of each of the sense circuits $SC_0$–$SC_n$. In response to the clock signal, the Gray Code sequencer provides Gray Codes to each of the memory address decoder 100 and the logic array address decoder 110. The decoder for the array 50 thus includes the Gray Code sequencer 90, the memory address decoder 100, and the sense circuit array 60.

The use of Gray codes is well known in the art for address decoding. A Gray code is a binary sequence in which only one bit changes in going from one state to the next, and has certain advantages with respect to transmission over busses within a device. The use of Gray codes in memory decoders is known, for example, from U.S. Pat. No. 5,687,352. In FIG. 3, the Gray code sequencer produces a 6 bit gray code which is used to drive the memory address decoder and the logic array address decoder.

The following table illustrates an exemplary Gray Code sequence used in the circuit of FIG. 3 and the corresponding state the sense amp.

TABLE

| STEP # | GRAY CODE | WORD LINES $B_0$—$B_n$ | CLOCK | STATE |
|---|---|---|---|---|
| 0 | 000000 | All 0 | 0 | Pre-charge all sense amps |
| 1 | 000000 | $B_0 = 1$ | 1 | Evaluate $B_0$, Cells $EE_{00}$–$E_{N0}$ |
| 2 | 000001 | All 0 | 0 | Pre-charge all sense amps |
| 3 | 000001 | $B_1 = 1$ | 1 | Evaluate B1, Cells $EE_{10}$–$EE_{1N}$ |
| 4 | 000011 | All 0 | 0 | Pre-charge all sense amps |
| 5 | 000011 | $B_2 = 1$ | 1 | Evaluate B2, Cell $EE_{20}$–$EE_{2N}$ |
| 6 | 000010 | All 0 | 0 | Pre-charge all sense amps |
| 7 | 000010 | $B_N = 1$ | 1 | Evaluate BN, Cell $EE_{N0}$–$EE_{NN}$ |

The sense circuit array 60 and Gray Code sequencer 90 operate in conjunction with the clock signal generator 80 as follows. With the Gray Code at the initial address (Step 1) and the clock signal at logic low, all word lines $B_0$–$B_N$ are logic low, rendering the access switch for each memory transistor non-conductive. All of the sense circuits $SC_{0-SCN}$ are precharged when the pcb terminal of each of the sense circuits receives the logic low clock signal. The decoder output of each sense circuit $SC_0$–$SC_N$ is logic low. When the clock signal goes high (Step 1), the Gray code remains the same, the access switch for each cell $EE_{00}$–$EE_{0N}$ on word line $B_0$ is rendered conductive and each sense circuit $SC_0$–$SC_N$ decodes the first cell of its respective bit line, i.e. the cells connected to the word line $B_0$. A conductive memory cell will conduct current and drive the bit line low, changing the output state of this sense circuit, as previously discussed with reference to FIG. 2. A non-conductive memory cell will not conduct current and will leave the bit line high. The state of the bit line and of each sense circuit will be sustained by the feedback transistor Q4. At the end of step 1, each of the cells $EE_{00}$–$EE_{0N}$ on word line $B_0$ has been decoded by a respective sense circuit $SC_0$–$SC_N$.

When the clock signal goes low again (Step 2), the Gray code sequencer 90 outputs the next sequential Gray code, which deactivates the access switches for the cells on word line $B_0$, so that all word lines $B_0$–$B_N$ are again deactivated. The sense circuits for all the bit lines are then pre-charged again. The next time the clock goes high (Step 3), the access switches for the cells $EE_{10}$–$EE_{1N}$ on word line $B_1$ are turned on and all of the cells on word line $B_1$ are decoded by the respective sense circuit $SC_0$–$SC_N$. This sequence continues along the word lines until all the cells on all of the word lines $B_0$–$B_N$ have been read. The addressing and sensing process is stopped when all cells have been decoded.

The advantage of the sense circuit according to the invention is that essentially no DC power is consumed for the purpose of inducing a DC current in the bit lines for sensing during the read operation. Rather, there is only dynamic current at the leading edge of the pre-charge, i.e. when the clock signal goes low and the line SA1 and the feedback switch of the relevant sense circuit are pre-charged. If a cell being read is conductive, there is also a similarly small dynamic current at the leading edge of the evaluation by the sense circuit, due to discharging of the sense circuit. For purposes of illustration, a known PLD having approximately 1000 sense amps operating according to the prior art consumed about 20–40 milliamps for the decode to initialize the PLD. A PLD with the sense circuit according to the invention is expected to have a current consumption reduced by a factor of about 10 to 50.

It should be noted that the array 60 of sense circuits also includes a standard output buffer associated with each sense circuit. Upon decoding of each cell of the memory array 50, the corresponding ones of the logic array latches LA are programmed by the output of the corresponding sense circuit under control of the logic array decoder in conjunction with the advancing Gray code sequence. Programming latches LA is conventional, and therefore not further described herein.

The process or technology by which the decoder of the invention is made is not important and any of the standard bipolar or CMOS processes can be used.

Although preferred embodiments of the present invention have been shown and described, it will be appreciated by those skilled in the art that changes may be made in these embodiments without departing from the principles and spirit of the invention, the scope of which is defined in the claims. For example, it will be clear from the foregoing that the number of array elements, i.e., the array size, in any of the arrays can be varied without departing from the principles described herein. Additionally, the invention is not limited to the use of Gray codes to advance the memory address decoder. Other suitable control signals may be used to control the address decoder and sense circuits.

The many features and advantages of the invention are apparent from the detailed specification and it is intended by the appended claims to cover all such features and advantages which fall within the true spirit and scope of the invention. Since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A decoder for a memory cell, the decoder comprising a sense circuit which senses the conduction state of said memory cell, characterized in that:
    the sense circuit includes a chargeable circuit portion which is charged when coupled to a first source of electric potential;
    the decoder includes an access switch which selectively couples the memory cell to a second, different source of electric potential; and
    the decoder controls the sense circuit and said memory cell (i) to couple said chargeable circuit portion to the source of electric potential to charge said chargeable circuit portion, the memory cell being decoupled via said access switch from said second source of potential so as to not discharge the chargeable circuit portion during charging thereof when the memory cell is conductive and (ii) to couple said chargeable circuit portion and said memory cell while the access switch couples the memory cell to the second source of potential such that said chargeable circuit portion is discharged in dependence on the conduction state of said memory cell.

2. A decoder according to claim 1, wherein said sense circuit comprises a pre-charge switch that selectively couples said chargeable circuit portion to the source of electric potential.

3. A decoder according to claim 1, wherein said sense circuit further includes a feedback switch which, when said chargeable circuit portion is not discharged by reason of said memory cell being non-conductive, couples said chargeable circuit portion to the source of electric potential, said feedback switch being a substantially weaker transistor than said pre-charge switch and charging said chargeable circuit portion with a substantially smaller current than said pre-charge switch.

4. A decoder according to claim 1, wherein said chargeable circuit portion includes at least one of (i) the parasitic body capacitance of a transistor in the sense circuit and (ii) the parasitic capacitance of a conductor within the sense circuit.

5. An integrated circuit including at least one memory cell and a sense circuit for sensing the conduction state of the memory cell, said sense circuit comprising:
    a first voltage supply;
    a first terminal coupled to said memory cell;
    an output terminal which outputs a logic signal indicative of the state of conduction of the memory cell;
    an inverter having an inverter input coupled to said first terminal and an inverter output coupled to said output terminal;
    a feedback switch having (i) a main current path with one end coupled to said first supply voltage and a second end coupled to said inverter input and to said first terminal and (ii) a control gate coupled to said inverter output; and
    a pre-charge switch having a (i) main current path with one end coupled to said first voltage supply and a second end coupled to said first terminal and to said inverter input, and (ii) a control terminal which receives a charge control signal,
    upon receipt of a first charge control signal at said pre-charge switch to pre-charge the sense circuit while said memory cell is not coupled to a second voltage supply having a lower potential than said first voltage supply, the sense circuit being pre-charged, the inverter output being logic low, and said feedback switch being conductive; and
    upon receipt of a second charge control signal at said pre-charge switch to render the pre-charge switch non-conductive and coupling of said memory cell to the second, lower voltage supply, said sense circuit being discharged in dependence on the conduction state of the memory cell,
    when the conduction state of the memory cell is conductive, the sense circuit being discharged and rendering the output of said inverter being logic high and said feedback switch non-conductive, and
    when the conduction state of the memory cell is non-conductive, the output of said inverter being logic low, and said feedback switch being conductive to maintain the output of the inverter logic low.

6. An integrated circuit according to claim 5, wherein said feedback switch is a comparatively much weaker transistor than said pre-charge switch and provides a substantially smaller current to said inverter input when in the conductive state.

7. A method of sensing the conduction state of a memory cell in an integrated circuit, comprising the steps of:
    coupling a chargeable circuit portion on the integrated circuit to a first source of electric potential to charge the chargeable circuit portion while the memory cell is decoupled from a second, different source of electric potential so as to not discharge the chargeable circuit portion during charging thereof when the memory cell is conductive;
    at least substantially decoupling the chargeable circuit portion from the first source of electric potential;
    coupling the chargeable circuit portion and the memory cell while the memory cell is coupled to the second source of potential so as to discharge the chargeable circuit portion when the memory cell is conductive; and outputting a signal indicative of the conduction state of the memory cell in dependence on the whether the chargeable circuit portion is discharged upon such coupling of the chargeable circuit portion and the memory cell.

8. A method according to claim 7, further comprising the step of:

coupling the chargeable cinruit portion to a source of electric potential via a weak transistor to maintain the output signal in the same state if the chargeable circuit portion is not discharged via a conductive memory cell.

9. An integrated circuit including at least one memory cell and a decoder for decoding the conduction state of said at least one memory cell, said decoder comprising:

means for coupling a chargeable circuit portion on the integrated circuit to a first source of electric potential to charge said chargeable circuit portion;

access switch means for selectively coupling the memory cell to a second, different source of electric potential, the memory cell being decoupled from the second source of potential so as to not discharge the chargeable circuit portion during charging thereof when the memory cell is conductive;

means for at least substantially decoupling said chargeable circuit portion from the first source of electric potential;

means for coupling said chargeable circuit portion and said at least one memory cell so as to discharge said chargeable circuit portion when said cell is conductive while said access switch means couples the memory cell to the second source of potential; and means for outputting an output signal indicative of the conduction state of said memory cell in dependence on whether said chargeable circuit portion is discharged upon such coupling of said at least one memory cell and said chargeable circuit portion.

10. An integrated circuit according to claim 9, further comprising:

a weak transistor coupling the chargeable circuit portion to a source of electric potential to maintain the output signal in the same state if the chargeable circuit portion is not discharged by the memory cell being non-conductive.

11. A programmable logic device, comprising:

a first programmable array comprising a plurality of memory cells each programmable between a first conductive state and a second, non-conductive state;

a second programmable array comprising a plurality of programmable elements;

a functional element coupled to the second programmable array, the functional element being controlled in dependence on the programmed state of the second programmable array;

a decoder, coupled to the first programmable array, which decodes the conduction state of said memory cells in the first programmable array and outputs logic signals indicative of the programmed state of said memory cells to program corresponding programmable elements of said second programmable array, said decoder comprising:

a sense circuit which includes a chargeable circuit portion which retains a charge when coupled to a first source of electric potential;

an access switch which selectively couples the memory cell to a second different source of electric potential; and the decoder controls the sense circuit and the first programmable array (i) to couple said chargeable circuit portion to the source of electric potential to charge said chargeable circuit portion while the access switch decouples the memory cell from the second source of potential so as to not discharge the chargeable circuit portion during charging thereof when the memory cell is conductive and (ii) to couple the sense circuit and memory cell when the access switch couples the memory cell to the second source of potential such that said chargeable circuit portion is discharged in dependence on the programmed state of said memory cell.

12. A programmable logic device according to claim 11, wherein said sense circuit comprises a pre-charge switch that selectively couples said chargeable circuit portion to the source of electric potential.

13. A programmable logic device according to claim 12, wherein said sense circuit further includes a feedback switch which, when said chargeable circuit portion is not discharged by reason of the sense circuit being coupled to a said memory cell programmed in the non-conductive state, couples said chargeable circuit portion to the source of electric potential, said feedback switch being a substantially weaker transistor than said pre-charge switch and charging said chargeable circuit portion with a substantially smaller current than said pre-charge switch.

14. A programmable logic device according to claim 13, wherein said sense circuit further includes an inverter having an inverter input and an inverter output, and said feedback switch includes (i) a main current path having one end coupled to the source of electric potential and a second end coupled to said inverter input and (ii) a control terminal coupled to said inverter output.

15. A programmable logic device according to claim 11, wherein said chargeable circuit portion includes at least one of (i) the parasitic body capacitance of a transistor in the sense circuit and (ii) the capacitance of a conductor within the sense circuit.

16. A programmable logic device according to claim 11, wherein said functional element comprises an array of logic gates.

17. A programmable logic device according to claim 11, wherein said functional element comprises a macrocell.

* * * * *